United States Patent
Dolezilek

(10) Patent No.: US 10,826,324 B2
(45) Date of Patent: Nov. 3, 2020

(54) MITIGATION OF GRATUITOUS CONDITIONS ON ELECTRIC POWER DELIVERY SYSTEMS

(71) Applicant: Schweitzer Engineering Laboratories, Inc., Pullman, WA (US)

(72) Inventor: David J. Dolezilek, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 125 days.

(21) Appl. No.: 15/982,201

(22) Filed: May 17, 2018

(65) Prior Publication Data

US 2019/0103762 A1    Apr. 4, 2019

Related U.S. Application Data

(60) Provisional application No. 62/508,281, filed on May 18, 2017.

(51) Int. Cl.
*H02J 13/00* (2006.01)
*H03K 19/17724* (2020.01)
*H02J 3/38* (2006.01)

(52) U.S. Cl.
CPC ........ *H02J 13/00006* (2020.01); *H02J 3/381* (2013.01); *H03K 19/17724* (2013.01)

(58) Field of Classification Search
CPC .. H02J 13/0013; H02J 3/381; H02J 13/00006; H02J 13/00034; H03K 19/17724
See application file for complete search history.

(56) References Cited

U.S. PATENT DOCUMENTS

| | | | |
|---|---|---|---|
| 6,633,823 B2 | 10/2003 | Bartone | |
| 7,283,916 B2 | 10/2007 | Cahill-O'Brien | |
| 7,715,887 B2 | 5/2010 | Cloutier | |
| 8,190,381 B2 | 5/2012 | Spanier | |
| 8,331,855 B2 | 12/2012 | Williams | |
| 8,453,234 B2* | 5/2013 | Dawson | H04L 43/00 713/188 |
| 8,893,216 B2* | 11/2014 | Yadav | H04L 63/0236 700/286 |
| 9,705,305 B2 | 7/2017 | Dolezilek | |
| 10,015,188 B2* | 7/2018 | Schneider | H04L 63/1425 |
| 10,637,880 B1* | 4/2020 | Islam | H04L 63/1408 |

(Continued)

OTHER PUBLICATIONS

PCT/US2015/022795 Patent Cooperation Treaty, International Search Report and Written Opinion of the International Searching Authority, dated Jun. 19, 2015.

*Primary Examiner* — Jennifer L Norton
(74) *Attorney, Agent, or Firm* — Richard M. Edge

(57) ABSTRACT

Mitigation of gratuitous conditions on an electric power delivery system is disclosed herein. Intelligent electronic devices (IEDs) may take actions on the electric power delivery system based on commands received via communications channels and based on detected electrical conditions. When a gratuitous condition (such as a cyber attack) is detected, a block command is provided to the IEDs such that the IEDs do not effect actions corresponding with commands received over a communications system. Communications may pass through a condition monitor of a communications device to detect insecurity and either block the communications or command the IED to enter interlock mode.

21 Claims, 6 Drawing Sheets

(56) References Cited

U.S. PATENT DOCUMENTS

| | | |
|---|---|---|
| 2004/0162642 A1 | 8/2004 | Gasper |
| 2009/0070447 A1 | 3/2009 | Jubinville |
| 2009/0112375 A1 | 4/2009 | Popescu |
| 2009/0299542 A1* | 12/2009 | Nuqui ................ H04L 41/0813 700/297 |
| 2010/0152910 A1* | 6/2010 | Taft ....................... G01D 4/002 700/286 |
| 2010/0222094 A1 | 9/2010 | Usuda |
| 2011/0035076 A1 | 2/2011 | Schweitzer |
| 2012/0063039 A1* | 3/2012 | Shah ..................... H02H 7/261 361/20 |
| 2012/0140367 A1* | 6/2012 | Wimmer ............... H02H 7/261 361/62 |
| 2012/0153722 A1* | 6/2012 | Nazarian .................. H02J 3/32 307/23 |
| 2013/0031201 A1 | 1/2013 | Kagan |
| 2014/0058689 A1* | 2/2014 | Klien ................... G01R 21/133 702/60 |
| 2014/0068711 A1 | 3/2014 | Schweitzer |
| 2014/0111377 A1* | 4/2014 | Achanta ............... G01S 19/215 342/357.58 |
| 2014/0293494 A1* | 10/2014 | Allen ...................... H02H 7/20 361/93.1 |
| 2015/0311714 A1 | 10/2015 | Dolezilek |
| 2016/0320785 A1* | 11/2016 | Kondabathini .......... H02H 3/00 |
| 2016/0366170 A1* | 12/2016 | Bell ....................... G01D 4/004 |
| 2017/0124333 A1* | 5/2017 | Shon ..................... G06F 21/577 |
| 2017/0310705 A1* | 10/2017 | Gopalakrishna .... H04L 41/0886 |
| 2018/0198821 A1* | 7/2018 | Gopalakrishna ........ G06F 21/53 |

* cited by examiner

MITIGATION OF GRATUITOUS CONDITIONS ON ELECTRIC POWER DELIVERY SYSTEMS

RELATED APPLICATIONS

This application claims benefit under 35 U.S.C. § 119(e) to U.S. provisional application Ser. No. 62/508,281 filed on 18 May 2017 titled "Mitigation of Invalid or Unwanted Conditions on Electric Power Delivery Systems" naming David J. Dolezilek as inventor, which is incorporated herein by reference in its entirety.

TECHNICAL FIELD

This disclosure relates to mitigation of gratuitous conditions on electric power delivery systems. More particularly, this disclosure relates to controlled response to unexpected commands or conditions in an electric power delivery system.

BRIEF DESCRIPTION OF THE DRAWINGS

This disclosure includes illustrative embodiments that are non-limiting and non-exhaustive. Reference is made to certain of such illustrative embodiments that are depicted in the figures described below.

DETAILED DESCRIPTION

Figure 1:
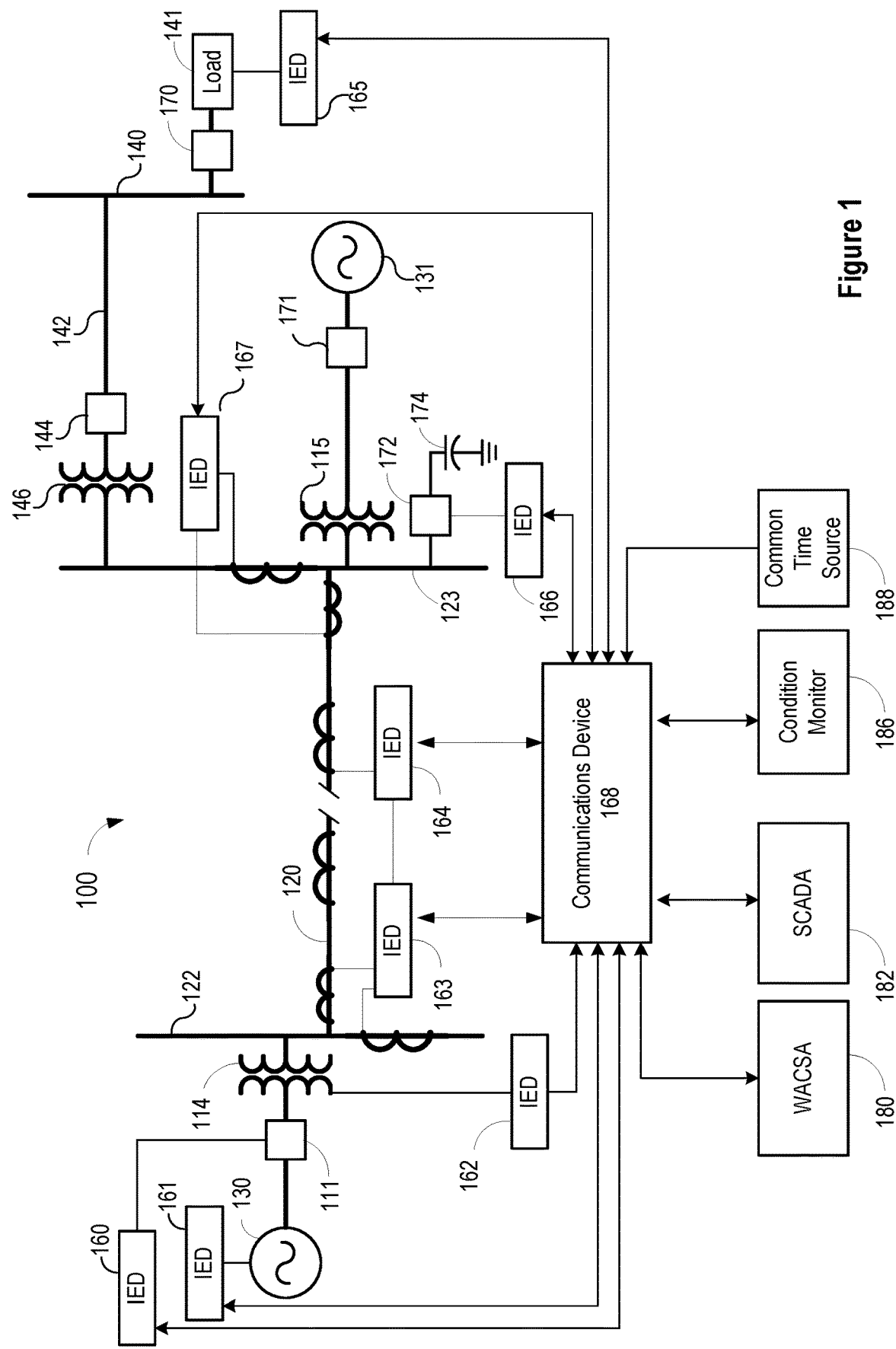
FIG. 1 illustrates a simplified one-line diagram of one embodiment of an electric power delivery system.

Electrical power generation and delivery systems generate, transmit, and distribute electrical energy to loads. Electrical power generation and delivery systems may include equipment such as electrical generators, electrical motors, power transformers, power transmission and distribution lines, circuit breakers, switches, buses, voltage regulators, capacitor banks, and the like. Such equipment may be monitored, controlled, automated, and/or protected using intelligent electronic devices (IEDs) that receive electric power delivery system information from the equipment, make decisions based on the information, and provide monitoring, control, protection, and/or automation outputs to the equipment.

An electric power system may include local protective devices to protect local components and portions of the electric power system. The local protective devices, in some instances, may protect a single component, such as a generator, or may be associated with a specific feeder or distribution branch. Local protective devices may provide measurement data to a regional or distributed protective device that may protect a plurality of local components or a larger portion of the electric power system. These regional or distributed protective devices may be referred to as wide-area protective devices in that they provide protection to a wider area than a local protection component. Regional or distributed protective devices may communicate with and control local protective devices to protect the wide area within their purview. Still higher level protective devices may receive measurement data and/or calculations from a plurality of regional or distributed protective devices to make wide-area control decisions for multiple regions and/or distributed protective devices. The number of levels of protective devices may depend on a particular application but is not limited to two or three. Each level of protection may control one or more sub-levels of protective devices.

Individual IEDs may also communicate directly with each other. For example, IEDs at different locations of a transmission line may provide differential protection by communicating electric power system measurements with each other.

Each component of primary equipment, such as a circuit breaker or switch, may be controlled by protective devices such as an external IED or include an integrated IED. In some installations, protective devices may be incorporated directly into power system equipment. For example, a generator may include an IED (which may be embodied as a simple electronic circuit, or may include a processor and memory for more complex operations) to control integrated protective devices such as breakers, voltage regulators, current regulators, frequency control devices, etc. A breaker may have an integrated IED to determine when to open and may also be in communication with higher lever IEDs that may instruct it to open as well. Each protective device, groups of protective devices, and/or the IEDs controlling protective devices may have adjustable protection settings. In other installations, protective devices may be external to the primary equipment.

In some embodiments, the protection settings of a IEDs are user-selectable. Coordination controllers, as described herein, may utilize the state of electric power system, current measurement values, and protection settings of downstream IEDs (such as distributed controllers) to determine a remedial action scheme (RAS). The RAS may define actions to be taken in response to various potential future conditions or events of the electric power system.

For example, a station controller may determine a RAS for a plurality of generators, breakers, distribution lines, and various loads. The RAS may define actions to be implemented if a generator were to lose power or otherwise go offline. The RAS may use a transient simulation model to determine the consequences of various events and actions. For example, a transient simulation model may indicate that if one of the generators were to go offline, that the other generators can continue to supply power to all the loads connected to the system, so long as the total load does not exceed a predetermined threshold. Above that threshold, the transient simulation model may indicate that load shedding may be necessary to avoid cascading failures. A RAS is not limited to the above examples, but rather may include any of a wide variety of actions to protect a wide variety of components and portions of an electric power system.

For example, a RAS may define actions to be taken in response to predetermined system conditions. The actions defined by the RAS may include, but are not limited to: curtailing or tripping generation or other sources; curtailing or tripping load; reconfiguring a system to meet specific reliability standards; modifying a topology (including adding generation, removing generation, adding load, and removing load) to maintain stability, system voltage, and/or acceptable power flow levels; prevent cascading failures; protect critical components of a system; protect and/or maintain power to critical loads; and/or the like. Many aspects of the RAS may be based on transient modeling of the behavior of the electric power system. The transient model of the electric power system may be highly dependent on the protection settings (e.g., set points) of various protective IEDs and/or protective devices within the system. In systems in which the protection settings may be user-selected and/or updated, a station controller, regional controller, centralized controller, or coordination controller implementing a RAS may be notified of the updated protection settings. A regional controller may provide coordinated protection for region. A centralized controller or multi-regional controller may provide higher level coordinated protection to multiple regions via a plurality of regional coordination controllers. The controller may use the updated protection settings to update the transient model simulations. The updated transient model simulations may warrant modification or updates to the RAS.

It should be noted that IEDs may control primary equipment (such as, for example, circuit breakers) as a response to different operational commands. As protective devices, IEDs may control primary equipment without outside command or approval due to observed power system conditions. For example, a protective IED may detect an overcurrent condition within its predetermined zone of protection, and due to such observation send a command to a circuit breaker to open to remove power to the effected portion of the electric power delivery system. Similarly, groups of IEDs may control primary equipment without outside command or approval due to observed power system conditions. One example of this includes line differential protection where two IEDs at different locations of the power system communicate observed power system conditions to each other to determine an event and/or the location of the event, and command one or more circuit breakers to open to isolate the event. When IEDs operate in a protective manner based on observed power system conditions, such operations are referred to herein as protective operations.

Alternatively, IEDs may operate power system equipment due to commands received from a supervisory or operations system such as, for example, a supervisory control and data acquisition (SCADA) system. A SCADA system may be in communication with an IED such that an operator may command a particular IED to take a particular action. For example, it may be determined that power transmission from one transmission bus to another distant transmission bus should be transferred from a first transmission line to a second transmission line. A SCADA system may be used to command certain IEDs to close certain circuit breakers to connect a transmission line into service, and command certain other IEDs to open certain circuit breakers to remove a transmission line from service. When IEDs operate in response to commands from operational systems such as SCADA, such operations are referred to herein as supervisory operations or supervisory commands.

The operational and/or communication systems in communication with IEDs to communicate electric power system conditions, protection signals, monitoring signals, supervisory commands and the like may be targeted by bad actors to introduce gratuitous conditions such as an attack on the electric power system or unintentionally used to bring about gratuitous conditions on the electric power delivery system. The communication system may be used to send false electrical power system conditions, or malicious protection, monitoring, and supervisory signals to IEDs. For example, the communication system may be used to send a command to a particular IED to open an associated circuit breaker. Targeted use of such nefarious commands may bring about insecurity of the electric power delivery system by local, regional, or even general disruption.

Insecurity of electric power delivery systems may be introduced by unintentional operation of primary equipment. Several embodiments of the present disclosure may be used to mitigate against unintentional operations that may introduce insecurity into the electric power delivery system, or limit further actions once the electric power delivery system is in a gratuitous state. Further, if the invalid command is due to a mistake by an operator, a mistakenly documented process, or an equipment malfunction an embodiment may be used to return information about the declined command in order to inform the SCADA operator. Accordingly, as used herein a "gratuitous" condition includes any unwanted condition that may be introduced into an electric power delivery system by a malicious command, a cyber attack, a mistaken command, a mistaken documented process, an equipment malfunction, and the like.

It has recently been observed that malicious actors were able to disrupt the delivery of electric power to end users by compromising an operations system such as SCADA, and using the operational system to send supervisory commands to IEDs to open circuit breakers across an electric power delivery system. In another incident, malicious actors compromised a device, loaded new malicious code, and used the new code to send commands that appeared to be authentic supervisory commands. The present disclosure includes embodiments that may be used to mitigate against such an attack by blocking such supervisory commands from the operations system to the IEDs, or blocking the IED from acting on command that will result in gratuitous conditions, when such an attack is detected. According to several embodiments herein, a communication that may lead to a gratuitous condition may be detected at one or more communications devices. Upon detection of the attack, the communications devices may block commands to IEDs to open circuit breakers and or block the IEDs from causing the circuit breaker to open. The attack may be detected by monitoring supervisory commands across the communications network; monitoring baseline conditions and comparing the baseline against a present condition; or the like. According to several embodiments herein, IEDs may continue with protective operations even when the communications devices have detected an attack, as operation signals to breakers and communications and commands originating from IEDs may be allowed to continue to pass between IEDs (whether using communications devices or not) while supervisory commands are blocked.

Accordingly, the present disclosure improves the operation of electric power delivery systems by mitigating against gratuitous operations while allowing for protection of the electric power delivery system. Furthermore, the present disclosure improves the operation of communications devices in an electric power delivery system by mitigating against supervisory operations during system insecurity while allowing for protection of the electric power delivery system.

As used herein, electric power system insecurity or the electric power system gratuitous condition may be due to purposeful action such as a cyber attack, a coordinated attack, or the like, or due to inadvertent actions as described above.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc. that perform one or more tasks or implement abstract data types.

A software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

Some of the embodiments of the disclosure can be understood by reference to the drawings, wherein like parts are generally designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. Well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 illustrates a simplified diagram of an example of an electric power delivery system 100. The systems and methods described herein may be applied and/or implemented in the system electric power delivery system 100 illustrated in FIG. 1. Although illustrated as a one-line diagram for purposes of simplicity, an electrical power delivery system 100 may be configured as a three-phase power system. The electric power delivery system 100 may include, among other things, electric generators 130 and 131, configured to generate an electrical power output, which in some embodiments may be a sinusoidal waveform.

Generators 130 and 131 may be selectively connected to the electric power delivery system using switches or circuit breakers 111 and 171, respectively. Step-up transformers 114 and 115 may be configured to increase the output of the electric generators 130 and 131 to higher voltage sinusoidal waveforms. Buses 122 and 123 may distribute the higher voltage sinusoidal waveform to a transmission line 120 between buses 122 and 123. Step-down transformer 146 may decrease the voltage of the sinusoidal waveform from bus 123 to a lower voltage suitable for electric power distribution on line 142. Distribution line 142 is further selectively connectable to bus 123 via circuit breaker or switch 144, and may distribute electric power to a distribution bus 140. Load 141 (such as a factory, residential load, motor, or the like) may be selectively connected to distribution bus 140 using switch or circuit breaker 170. Additional transformers or other equipment may be used to further step down a voltage from the distribution bus 140 to the load 141.

Various other equipment may be included in the electric power delivery system. Also illustrated is switched capacitor bank ("SCB") 174 selectively connectable to transmission bus 123 using circuit breaker or switch 172. Other equipment that may be included in the electric power delivery system may include, for example, static VAR compensators, reactors, load tap changers, voltage regulators, autotransformers, and the like. Some of these are considered as included in the electric power system 100 such as, for example, load tap changers can be considered as part of the load 141. Generators 130 and 131, may be any generator capable of providing electric power to the electric power delivery system, and may include, for example, synchronous generators, turbines (such as hydroelectric turbines, wind turbines, gas-fired, coal-fired, and the like), photovoltaic electric generators, tidal generators, wave power generators, and the like. Such generation machines may include components such as power-electronically coupled interfaces for example doubly-fed induction machines, direct coupled AC-DC/DC-AC transfer devices, and the like. Other equipment, machines, and connected devices may be included as well, as appreciated by one of skill in the art.

Typically, electric power delivery systems have been reliable. However, the possibility of events exists that can drive electric power delivery systems into an unstable state. Generally, instabilities include, for example, rotor angle instability, voltage collapse, frequency deviation, equipment failure, faults, and instability due to structural limitations of the electric power delivery system. Instability may be brought about by targeted actions, or even unintentional actions on the electric power delivery system. For example, opening a particular circuit breaker may cause a voltage collapse on a portion of the electric power delivery system. Opening multiple circuit breakers may bring about further instability. Operating voltage regulators, generator governors, SCBs or the like may bring about instability. Further still, commanding IEDs to change settings may bring about instability by causing the IEDs to misoperate on the electric power system conditions measured thereby. In other cases, in spite of not causing wide area instability, opening all circuit breakers in a substation may cause an invalid configuration of the electric power system which may result in a regional, undesired blackout.

Modern electric power delivery systems (which may include electric power generation systems, transmission systems, distribution systems, and consumption systems) are controlled using IEDs. FIG. 1 illustrates several IEDs 160-167 that may control the one or more protective devices (e.g., protective elements) of the electric power delivery system. As described above, an IED may be any processor-based device that controls monitored equipment within an electric power delivery system (e.g., system 100) or may be a circuit integrated within equipment. IEDs may obtain and/or derive a state of the electric power delivery system. The state may include equipment status, measurements, and/or derived or calculated values. In some embodiments, the IEDs 160-167 may gather equipment status from one or more pieces of monitored equipment (e.g., generator 130).

Equipment status may relate to the status of the monitored equipment, and may include, for example, breaker or switch open or closed, valve position, tap position, equipment failure, rotor angle, rotor current, input power, automatic voltage regulator state, motor slip, reactive power control set point, generator exciter settings, and the like. Further, the IEDs 160-167 may receive measurements concerning monitored machines or equipment using sensors, transducers, actuators, and the like. Measurements may relate to a measured status of the machine or equipment, and may include, for example, voltage, current, temperature, and the like.

With the equipment status and/or measurements, IEDs may be configured to derive or calculate derived values. Such derived values may be any values derived or calculated from the measurements and/or equipment status and may include, for example, power (real and reactive), magnitudes and angles of voltages and currents, frequency, rate of change of frequency, phasors, synchrophasors, fault distances, differentials, impedances, reactances, symmetrical components, alpha components, Clarke components, alarms, and the like.

IEDs may also determine a protection or controller condition using equipment status, measurements, and/or derived values, applied to an IED model. The protection or controller condition may depend on protection settings of the IED and/or associated protective devices. The controller condition may include, for example, a state of the IED protection, automation, control, or metering elements, encroachment timers, an integrating overcurrent integration position, pickup counts for enabling a release of a trip signal, and the like.

IEDs may be used to control various aspects of the electric power delivery system. To this end, they may include protection elements such as, for example, an instantaneous overcurrent element; an inverse-time overcurrent element; a thermal element; a reactive power threshold; a distance element; a current differential element; a load encroachment element; an impedance characteristic; a volts/Hz characteristic; an undervoltage element; a directional element; a negative sequence current element; a loss of excitation element; a negative sequence voltage element; an overvoltage element; a ground fault element; a high-impedance fault element; an underfrequency element; an overfrequency element; and the like.

Furthermore, IEDs may include control elements, related to electric power delivery system equipment. Accordingly, an IED may be configured as a reactive power controller, a capacitor bank controller, a transformer tap changing controller, a generator over-excitation limit controller, a governor controller, a power system stabilizer controller, a shunt reactor controller, a DC line controller, an inverter controller, and the like. It should be noted that a single IED may include one or more protection elements and/or control elements.

According to certain embodiments, IEDs 160-167 may issue control instructions to the monitored equipment in order to control various aspects relating to the monitored equipment. Typical control actions may be described as being in one of two categories: namely, discontinuous control, and continuous control. Protective control instructions may be based on protection settings of the IED. The protection settings of the IED may be manually entered, based on fault current studies, and/or dynamically adjusted based on instantaneous system conditions (e.g., from measured data).

An IED (e.g., IED 160) may be in communication with a circuit breaker (e.g., breaker 111), and may send an instruction to open and/or close the circuit breaker, thus connecting or disconnecting a portion of a power system. In another example, an IED may be in communication with a recloser and control reclosing operations. In another example, an IED may be in communication with a voltage regulator and instruct the voltage regulator to tap up and/or down. Information of the types listed above, or more generally, information or instructions directing an IED or other device or equipment to perform a certain action, may be generally referred to as control instructions or protective instructions that define a protective action to be implemented.

IEDs 160-167 may be communicatively linked using a data communications network, and may further be communicatively linked to a supervisory system, such as SCADA system 182, and/or a wide area control and situational awareness (WACSA) system 180. The SCADA system 182, the communications device 168, and/or the WACSA system 180 may utilize transient model simulations based on the topology of the power system, measurement data, and updated protection settings of various IEDs to develop a dynamic RAS. The RAS may be utilized to protect the electric power system as a whole, protect specific components therein, and/or minimize or eliminate potential cascading failures.

The illustrated embodiments are configured in a star topology having a communications device 168 at its center, however, other topologies are also contemplated. For example, the IEDs 160-167 may be communicatively coupled directly to the SCADA system 182 and/or the WACSA system 180. Certain IEDs, such as IEDs 163 and 164, may be in direct communication with each other to effect, for example, line differential protection of transmission line 120. The data communications network of the system 100 may utilize a variety of network technologies, and may comprise network devices such as modems, routers, firewalls, virtual private network servers, and the like.

IEDs 160-167 may be communicatively coupled with various points to the electric power delivery system 100. For example, IEDs 163 and 164 may monitor conditions on transmission line 120. IED 160 may be configured to issue control instructions to associated breaker 111. IEDs 163, and 167 may monitor conditions on buses 122, and 123. IED 161 may monitor and issue control instructions to the electric generator 130. IED 162 may monitor and issue control instructions to transformer 114. IED 166 may control operation of breaker 172 to connect or disconnect SCB 174. IED 165 may be in communication with load center 141, and may be configured to meter electric power to the load center. IED 165 may be configured as a voltage regulator control for regulating voltage to the load center using a voltage regulator (not separately illustrated).

In certain embodiments, communication between and/or the operation of various IEDs 160-167 and/or higher-level systems (e.g., SCADA system 182 or WACSA 180) may be facilitated by a communications device 168. The communications device 168 may also be referred to as a central IED, communication processor, wide-area controller, or access controller. In various embodiments, the communications device 168 may be embodied as the SEL-2020, SEL-2030, SEL-2032, SEL-2240, SEL-3332, SEL-3378, SEL-3530, SEL-3505, SEL-2730M, SEL-2740S, SEL-2740M, or SEL-3555 RTAC available from Schweitzer Engineering Laboratories, Inc. of Pullman, Wash. Examples of communications device are also described in U.S. Pat. Nos. 5,680,324, 7,630,863, and 9,401,839, the entireties of which are incorporated herein by reference.

It should be noted that more than one communication device may be used. For example, communications devices may be located at different substations, and in communication with a central communication device and/or other communications devices in ring, star, or other topologies. In various embodiments, each IED may be in communication with a local communication device; and the local communications devices are in communication with a central communications device 168, or in direct communication with each other. Communications devices may be in the form of communications switches such as a software defined network (SDN) switch, a managed switch, an unmanaged switch, or the like. Communications devices may be in the form of communications gateways such as the SEL-3622 Security Gateway.

The IEDs 160-167 may communicate a variety of types of information to the communications device 168 including, but not limited to, operational conditions, status and control information about the individual IEDs 160-167, event (e.g., a fault) reports, communications network information, network security events, and the like. In some embodiments, the communications device 168 may be directly connected to one or more pieces of monitored equipment (e.g., the electric generator 130 or the breakers 111, or 172).

The communications device 168 may also include a local human machine interface (HMI). In some embodiments, the local HMI may be located at the same substation as communications device 168. The local HMI may be used to change settings, issue control instructions, retrieve an event report (which may originate from a specified IED), retrieve data, and the like. The communications device 168 may further include a programmable logic controller accessible using the local HMI.

The communications device 168 may also be communicatively coupled to a common time source 188 (e.g., a clock). In certain embodiments, the communications device 168 may generate a time signal based on the common time source 188 that may be distributed to communicatively coupled IEDs 160-167. Alternatively, IEDs may be individually connected to a common time source. Based on the time signal, various IEDs 160-167 may be configured to collect and/or calculate time-aligned operational conditions including, for example, synchrophasors, and to implement control instructions in a time coordinated manner. IEDs may use the time information to apply a time stamp to operational conditions and/or communications. In some embodiments, the WACSA system 180 may receive and process the time-aligned data, and may coordinate control actions at the highest level of the electrical power generation and delivery system 100. In other embodiments, the communications device 168 may not receive a time signal, but a common time signal may be distributed to IEDs 160-167.

The common time source 188 may also be used by the communications device 168 for time stamping information and data. Time synchronization may be helpful for data organization, real-time decision-making, as well as post-event analysis. Time synchronization may further be applied to network communications. The common time source 188 may be any time source that is an acceptable form of time synchronization, including, but not limited to, a voltage controlled temperature compensated crystal oscillator, Rubidium and Cesium oscillators with or without a digital phase locked loops, microelectromechanical systems (MEMS) technology, which transfers the resonant circuits from the electronic to the mechanical domains, or a Global Navigational Satellite System (GNSS) such as a Global Positioning System (GPS) receiver with time decoding. In the absence of a discrete common time source 188, the communications device 168 may serve as the common time source 188 by distributing a time synchronization signal.

Condition monitor 186 may be configured to perform and monitor communications to and between IEDs. For example, condition monitor 186 may monitor communications to IEDs whether the communications originate from the WACSA 180, SCADA 182, local HMI, or other IEDs. Condition monitor 186 may use information from IEDs in conjunction with communications from the WACSA 180, SCADA 182, HMI, or other IEDs to determine whether commands would lead to power system insecurity such as by being a result of an attack on the electric power delivery system.

As briefly discussed above, it has been observed that electric power delivery systems may be attacked by sending commands to IEDs through an operations system such as, for example, a SCADA system. A bad actor may gain communication access to the operations system, use the operations system to determine IED location and operation, and send supervisory commands to IEDs such as open commands. Attacks may result in collapse of part or all of an electric power delivery system.

According to various embodiments, the condition monitor 186 may be configured to monitor supervisory commands routed to IEDs and determine whether such commands correspond with gratuitous conditions such as an attack on the electric power delivery system. The condition monitor may be configured to monitor the status of IEDs and circuit breakers and request status directly from IEDs, and use such configuration information in its determination of whether supervisory commands correspond with insecurity condition indications. If the condition monitor determines that supervisory commands correspond with a gratuitous condition, it may be configured to take a protective action. In one embodiment, the condition monitor may send an interlock signal to one or more IEDs or a signal to block supervisory commands received over SCADA, WACSA, or the local HMI. In another embodiment, the condition monitor may send an interlock signal or a block command to all IEDs to not open circuit breakers upon receipt of supervisory commands from SCADA, WACSA, or the local HMI. The condition monitor may be configured to continue blocking for a predetermined amount of time or upon occurrence of a predetermined event such as a reset command. In one embodiment, IEDs may continue to apply protection algorithms and protect the electric power system (even opening breakers), but block supervisory commands that originate from an operations system. In another embodiment, the condition monitor may send an interlock signal to IEDs to cause them to change their internal configuration settings, settings group, or the like to use different preconfigured logic appropriate for the new power system configuration or recognized threats to same.

In one embodiment, the condition monitor may be configured to determine if the operations of the electric power delivery system are outside of a predetermined baseline, and block open commands when it is determined that the electric power delivery system is outside of the predetermined baseline. A gratuitous condition may be detected when conditions are outside of the predetermined baseline. The predetermined baseline may be determined by the condition monitor after monitoring the electric power delivery system for a time. The predetermined baseline may be configured by a user of the condition monitor. The predetermined baseline may include a definition of unexpected supervisory operations and combinations, where the definition may be entered by a user at configuration time of the condition monitor. In another embodiment, the predetermined baseline may include a definition of expected supervisory operations and combinations, where the definition may be entered by a user at configuration time of the condition monitor. Supervisory operation commands outside of the baseline may result in the condition monitor blocking such commands as described herein.

In one embodiment, the condition monitor may determine if supervisory commands correspond with signatures of malicious attacks. Signatures may be predetermined, and/or configured by a user.

In one embodiment, the condition monitor and/or the IEDs may be configured to pulse an alarm contact upon detection of unauthorized commands. Such alarm contacts may be useful to alert operators of a possible attack. Further, the alarm contact signals may be used to alert operators that a commanded action was not taken. The condition monitor and/or IEDs may be configured to send signals to operators or other recipients upon detection of the gratuitous condition using various means such as SCADA, email, wireless, or the like and sound horns and flash lights to warn local personnel.

In one embodiment, upon detection of gratuitous conditions or determination that operations are outside of a predetermined baseline, the condition monitor may signal the communication device to delay commands communicated over SCADA.

According to various embodiments, the methods provided herein may be performed by a cyber logic module. The cyber logic module may be present in any IED or communication device that handles communications to IEDs. In one embodiment described in more detail herein, a condition monitor comprises the cyber logic module. In another embodiment, the communications device 168 may comprise the cyber logic module. In another embodiment, a SCADA communications device comprises the cyber logic module. In yet another embodiment, several communications devices comprise cyber logic modules.

Figure 2:
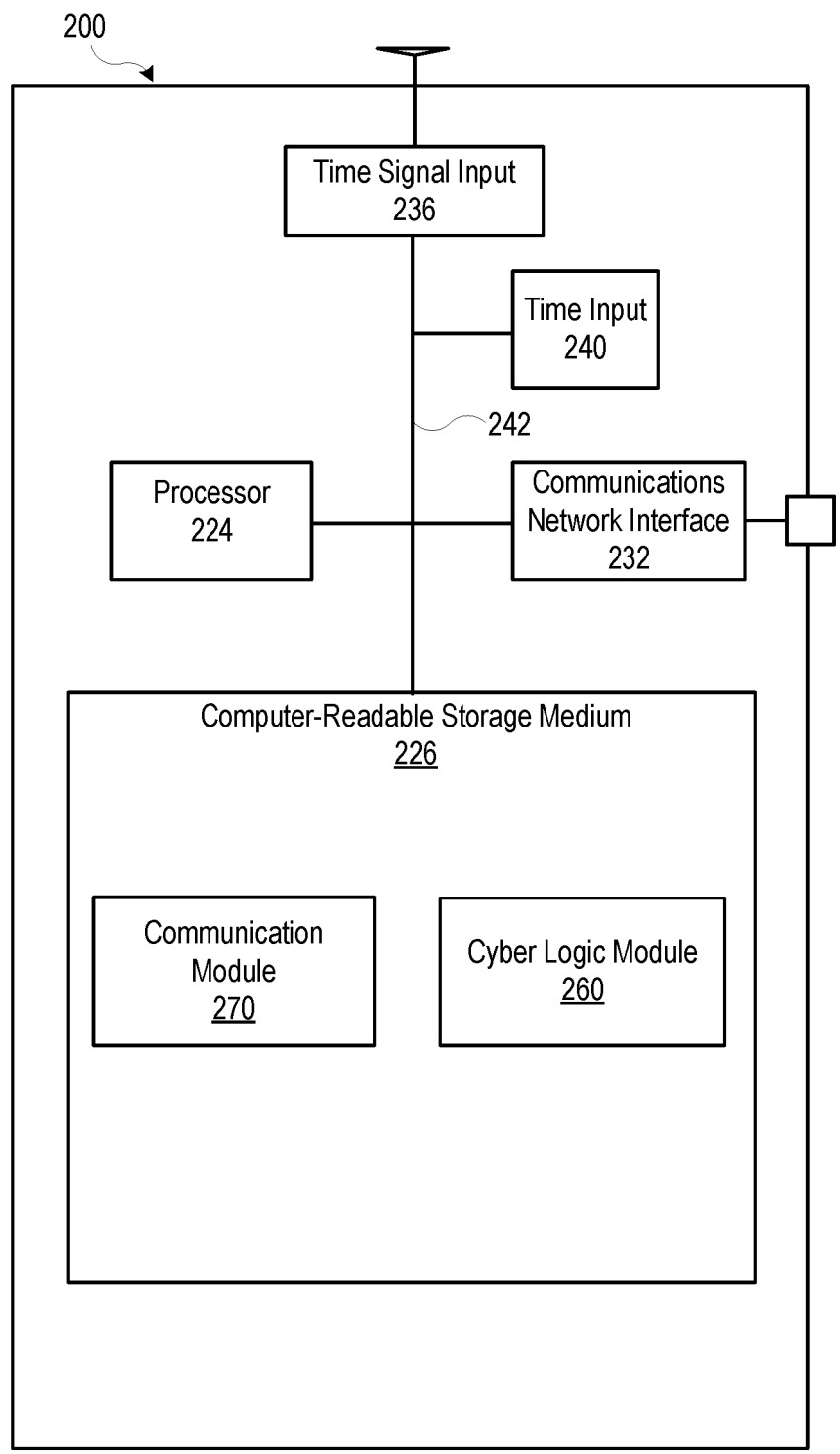
FIG. 2 illustrates a functional block diagram of a condition monitor according to several embodiments.

FIG. 2 illustrates a functional block diagram of an example of a condition monitor 200. In some embodiments, one or more components and/or modules may be omitted. Condition monitor 200 may include a time signal input 236, a time input 240, a communications network interface 232, and a processor 224. In some embodiments, the condition monitor 200 does not receive measurements or equipment status directly from a machine or equipment, and so does not include a monitored equipment interface. In other embodiments, the condition monitor may include a monitored equipment interface. A data bus 242 may link the time input 240, the network interface 232, the time signal input 236, and the computer-readable storage medium 226 to a processor 224. The communications network interface 232 may monitor communications on the network received from a communications device 168.

The computer-readable storage medium 226 may include modules for performing the operations of the condition monitor. The computer-readable storage medium 226 may include a cyber logic module 260 which may include instructions for determining gratuitous conditions such as an attack on the electric power delivery system and provide commands to various IEDs to counter such attack. The cyber logic module 260 may include instructions according to several embodiments herein.

The computer-readable storage medium 226 may include a communication module 270. The communication module 270 may include instructions for facilitating communications with the various IEDs, WACSA, SCADA, Local HMI, and other devices. The communication module 270 may include instructions for controlling the communications network interface 232 for communicating with various devices.

The communication module 270 may include instructions regarding communication of information and commands from the cyber logic module 260. The communication module 270 may include instructions on the formatting of communications according to a predetermined protocol. The communication module 270 may further trigger event reports, network communication event reports, data collection or the like. For example, upon detection of a gratuitous condition, the communication module may be configured to save event reports, network communication event reports, other data collection, sending messages to operators, or the like.

The communications devices and/or IEDs may be configured to communicate according to the IEC 61850 protocol, wherein the communication module 270 may be configured to format communications according to that protocol, receive communications according to that protocol, and make information therefrom available to other modules. The communication module 270 may be configured with subscribers to certain information, and format message headers according to such subscription information. The communication module 270 may be configured to format communications according to a wide variety of packet structures.

Both protection and supervisory control operations may be regularly applied by IEDs. The embodiments of this disclosure bring an extra layer of protection before IEDs apply protection and automation control actions in cases where an attack on the electric power system has been detected. That is, when the condition monitor obtains information regarding insecurity of the electric power delivery system such as a likelihood of an attack, the condition monitor may communicate with the various IEDs to delay or not take certain control actions which originate from a communication system. That is, IEDs may continue to take protective actions resulting from local protection and automation algorithms, but not take actions resulting from supervisory commands from a communication system. In further embodiments, the IEDs may continue to take protective actions resulting from local and/or communications, but not take supervisory actions from operations systems.

Figure 3A:
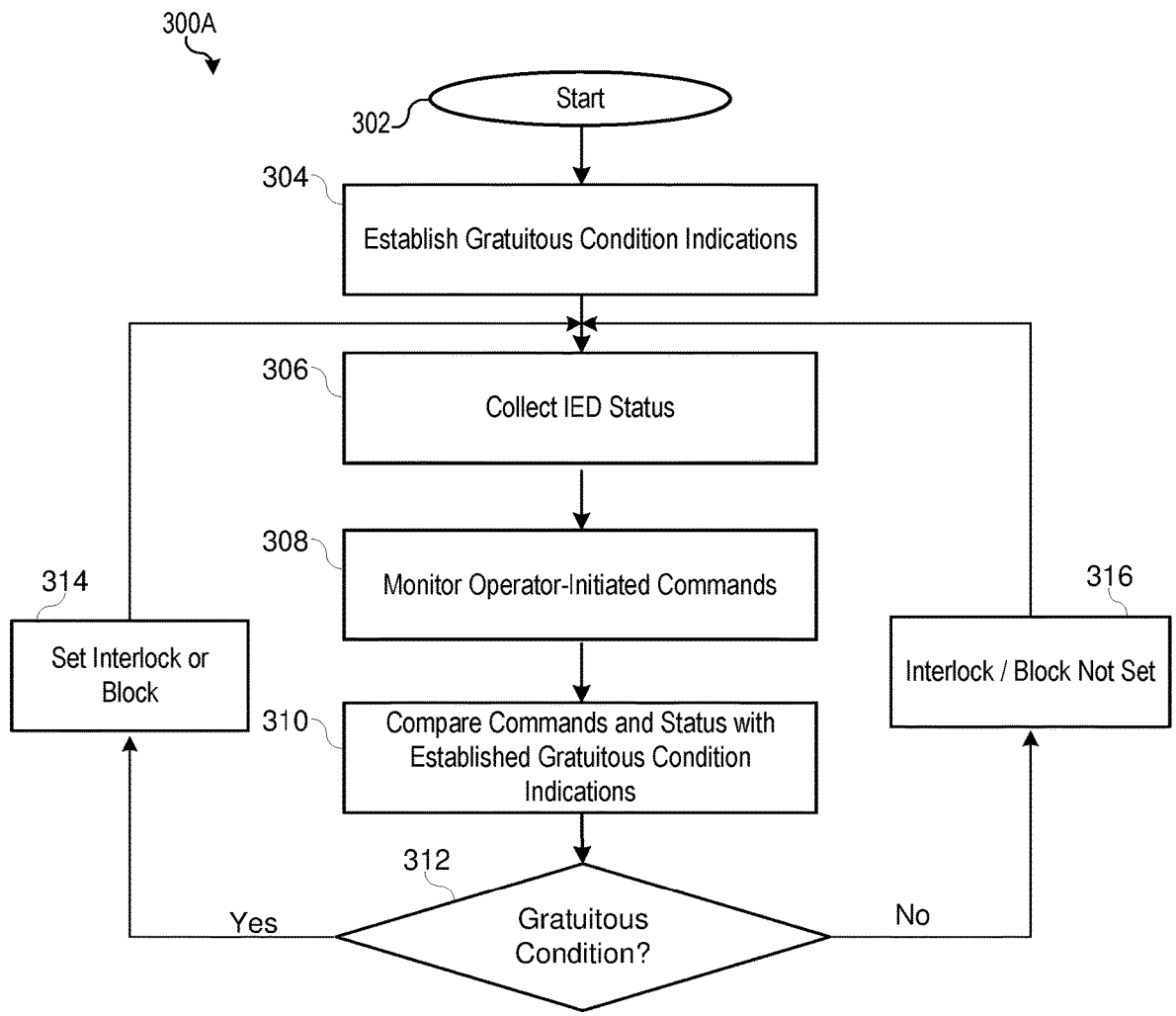
FIGS. 3A and 3B illustrate methods for mitigating gratuitous conditions on an electric power delivery system according to several embodiments.

FIG. 3A illustrates one method 300A of mitigating gratuitous conditions on electric power delivery systems. Method 300A may be used in systems where communications between IEDs comply with a protocol that includes heartbeat or periodic status communications between devices such as, for example, SEL MIRRORED BITS Communications or IEC-61850 GOOSE. In such a system, the communication device may be configured to send messages to the IEDs on a scheduled basis, where a state change may trigger a change in the messages, and may also trigger a temporary different message schedule.

As mentioned herein, gratuitous conditions may initiate by a user initiating commands using a supervisory system to bring about actions to be taken by particular IEDs. In a typical electric power delivery system, IEDs would receive the supervisory command via a communication system, and take action on the command as directed. Accordingly, the IEDs may be used to disrupt or interfere with an electric power delivery system as a result of commands to the IEDs using the supervisory system from a single location or even remotely. Several embodiments of the present disclosure provide cyber protection by commanding the IEDs to block or interlock or delay commands received by the IEDs over a communication system, upon detection by the cyber protection module of a gratuitous condition.

According to several embodiments, the method starts 302 with an establishment of gratuitous condition indications 304 such as an attack on the electric power delivery system. This step may occur during setting or configuration time, or in other embodiments may occur during operation time with the device establishing a baseline. The device may store the established conditions in a computer-readable storage medium. The established gratuitous condition indications may consist of settings provided by an operator. The settings may provide that during a normal operating condition of the electric power delivery system, multiple open commands from an operator may be determined as detected gratuitous conditions. In another embodiment, when the open commands originate from an operator outside of a substation may be determined as a gratuitous condition. The settings may provide that during normal operation, certain breakers or switches are expected to be in a certain state, such as the closed position, other specific breakers or switches are expected to be in the open position, certain breakers or switches are not expected to be operated, and the like. In other embodiments, a number of open commands within a predetermined time period may be established as a gratuitous condition. Thus, during normal operation of the electric power delivery system if any of the established gratuitous condition indications are met, a gratuitous condition may be detected. Further, during normal operation if a command would bring about the established conditions, a gratuitous condition may be detected.

In some embodiments, the established gratuitous condition indications may be dependent on external conditions such as weather or maintenance conditions. For example, if no weather storm is present, no maintenance condition has been entered, and no IEDs have determined a fault or other abnormal condition, the provision of multiple operator commands to open circuit breakers may be determined as a possible insecure situation that will result in a gratuitous condition such as a power outage.

Further still, the gratuitous condition indications may be dependent on entering a maintenance state. For example, when a maintenance operation is taking place on a predetermined section of the electric power delivery system, closing a breaker or switch to supply power to that section may be determined as a gratuitous operating condition.

In step 306 the method collects IED status from the various IEDs on the electric power delivery system. IED status may include status of primary equipment such as switches and breakers. The method may monitor operator initiated commands 308 such as supervisory commands. The operator initiated commands and IED status may be compared against the established gratuitous condition indications in 310. If either the operator initiated commands or the IED status result in a gratuitous condition, a gratuitous condition may be determined. In 312 when the gratuitous condition indications are not met, the method may continue to send the periodic or heartbeat message without an interlock or block set 316. The method then returns to monitoring operator-initiated commands and IED status 306. If, however, in 312 the gratuitous condition indications are met, the method may take an action 314 such as sending block commands to the IEDs, sending an interlock signal to the IEDs, or the like, in the periodic or heartbeat message. Thus, the IEDs will not open circuit breakers based on commands over communications until the interlock or block message is lifted from the periodic or heartbeat message.

Figure 3B:
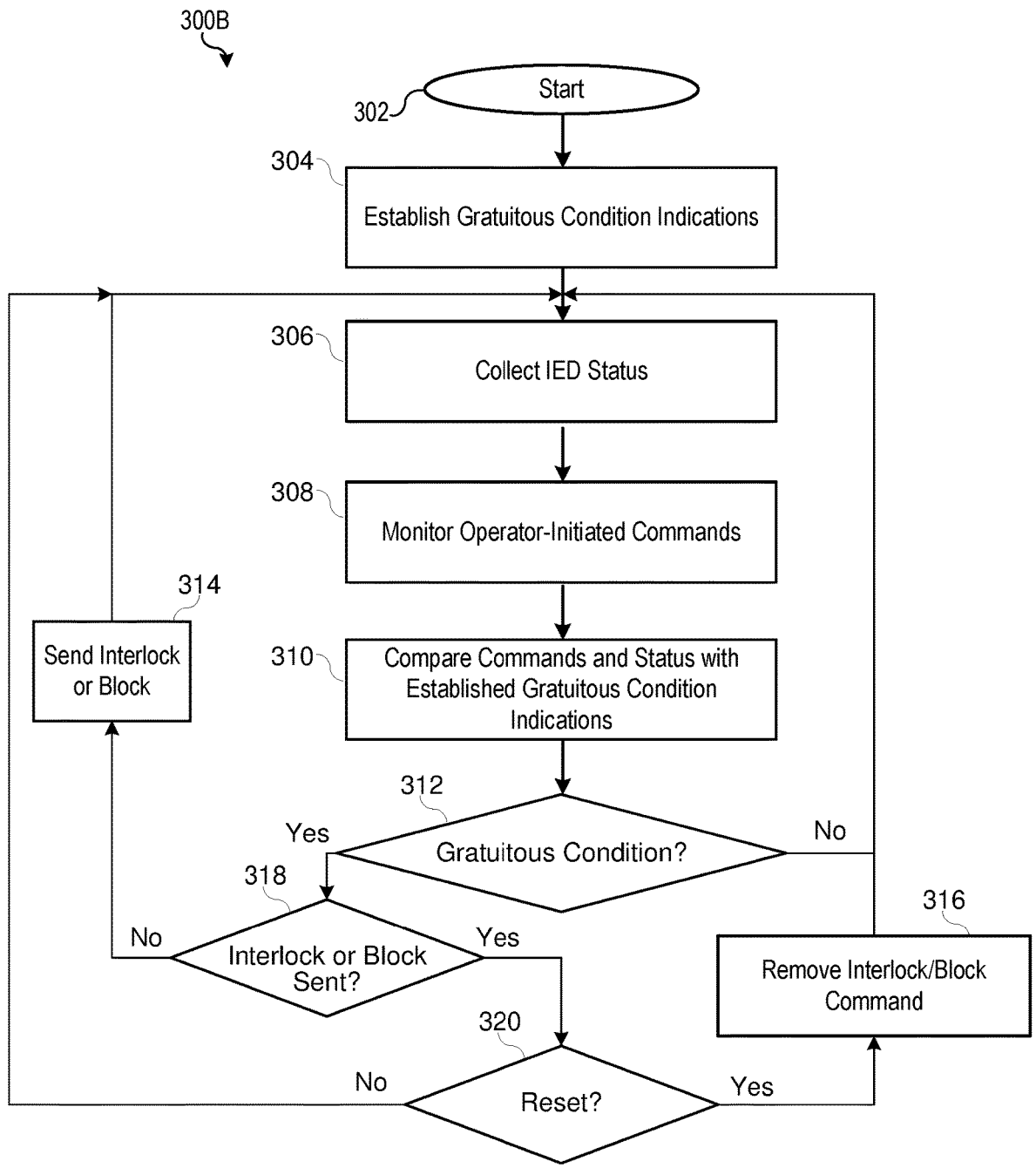

FIG. 3B illustrates another method 300B of mitigating against gratuitous conditions on electric power delivery systems. Method 300B may be used in systems where IEDs may receive commands from supervisory systems automation systems, or the like. The method may start 302 with establishing gratuitous condition indications 304. With the established gratuitous condition indications, the method may collect IED status 306 and monitor operator-initiated commands 308, such as supervisory commands provided using the supervisory system. The operator initiated commands and IED status may be compared against the established gratuitous condition indications in 310. If either the operator-initiated commands or the IED status result in a gratuitous condition, a gratuitous condition may be determined. In 312 when the gratuitous condition indications are not met, the method continues with collecting IED status 306 and monitoring operator initiated commands 308.

If, however, gratuitous condition indications are met 312, the method determines whether an interlock or block command was previously sent 318. If not, the interlock or block command is sent 314 to the IEDs, and the method continues with collecting IED status 306 and monitoring operator initiated commands 308. If the interlock or block signal has previously been sent 318, the method determines if a reset condition has been met 320. If the reset condition has not been met, the method continues with collecting IED status 306 and monitoring operator initiated commands 308. If the reset condition has been met 320, the method may remove the interlock/block command 316 (in one embodiment, by signaling the IEDs), and returns to continue with collecting IED status 306 and monitoring operator initiated commands 308.

A reset event may be a lapse of a timer for a block condition, a user command to reset, or the like. In several embodiments, a reset may have certain security requirements such that a remote attacker would be less likely to effect the reset. In one embodiment, the reset may require physical presence of a user in a substation or control center to physically manipulate a device. For example, the reset may require operation of a physical switch inside a substation or control center. In other embodiments the reset may require entering of a password or cryptographic key held only by authorized parties.

Figure 4A:
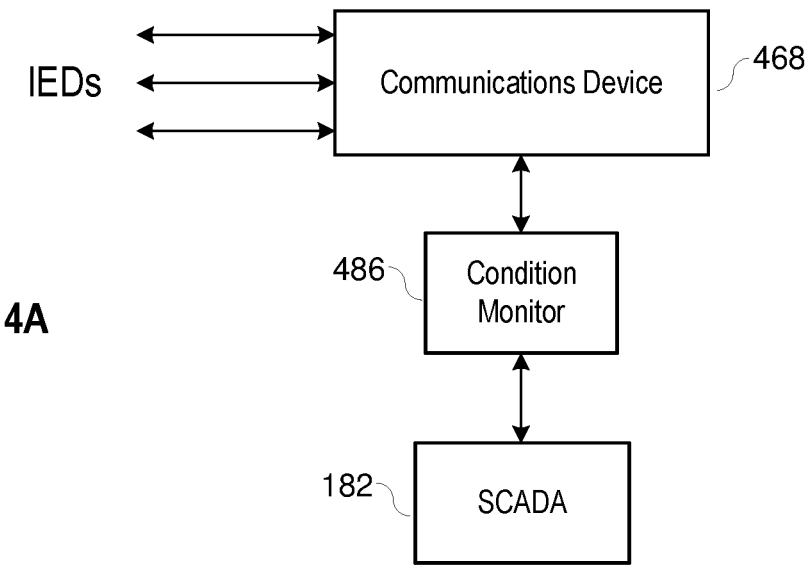
FIGS. 4A and 4B illustrate simplified block diagrams of systems for mitigation of gratuitous conditions according to several embodiments.

FIG. 4A illustrates a simplified block diagram of another embodiment of a system to mitigate gratuitous conditions on an electric power delivery system according to several embodiments herein. The communications device 468 may be similar to the communications device 168 of FIG. 1 in that it is in communication with one or more IEDs, and may be in communication with one or more of a WACSA, SCADA system, local HMI, time source, and the like. A condition monitor may also be in communication with the communications device 468 according to the several embodiments disclosed herein. The SCADA system 182 may be in communication with the IEDs via a connection to the condition monitor 486. Accordingly, all SCADA communications with the various IEDs may be monitored by the condition monitor 486. In certain embodiments, the communications from SCADA 182 may be monitored by the condition monitor 486 as disclosed above. Upon detection of a gratuitous condition by the condition monitor 486, certain communications may be simply blocked by the condition monitor 486 from being communicated to the various IEDs. In other embodiments, the communications from SCADA 182 may continue to be presented to the IEDs, but a block command as disclosed above may also be communicated to the various IEDs.

In certain embodiments, the condition monitor 486 may be configured to translate or re-package communications received from SCADA 182 before sending the commands or communications to the IEDs via the communications device 486. This may be useful in systems where the IEDs or the communication network operate according to protocols different from the protocol used by SCADA. This may also be useful to further insulate the IEDs from commands from SCADA that may result in a gratuitous condition on the electric power delivery system.

In yet another embodiment, the condition monitor 486 may be configured to require further authentication from SCADA upon detection of a gratuitous condition before supervisory commands from SCADA are allowed to be communicated to the various IEDs. In still further embodiments, the condition monitor 486 may be configured as a communication gateway that may require multiple layers of authentication before any commands from SCADA 182 or other interfaces are allowed to be transmitted to any IEDs.

Figure 4B:
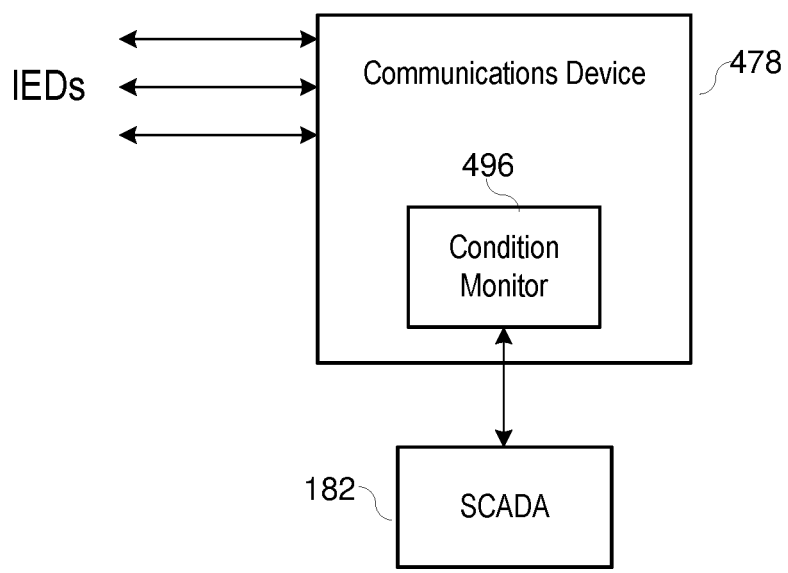

FIG. 4B illustrates a simplified block diagram of another embodiment of a system similar to that of FIG. 4A. The communications device 478 may be configured to include the condition monitor 496, which may function similarly to the condition monitor 486 illustrated in FIG. 4A. Condition monitor 496 may be embodied as a logical module of the communications device 478.

In certain of the embodiments illustrated and described in FIGS. 4A and 4B may be configured such that all communications from SCADA 182 must pass through the condition monitor before supervisory commands received over SCADA are communicated to the IEDs. In other embodiments a command from the condition monitor is sent to the IEDs prior to the receipt of a supervisory commands which blocks or allows the IED to act on the command received over SCADA communicated directly to the IEDs, as separately illustrated in FIG. 5. In other embodiments, only communications from a supervisory and operational systems must pass through the condition monitor to the IEDs, but communications directly from one IED to another may pass without further filtering by a condition monitor, allowing for rapid protective actions to occur while limiting automation commands to periods where a gratuitous condition has not been detected.

Figure 5:
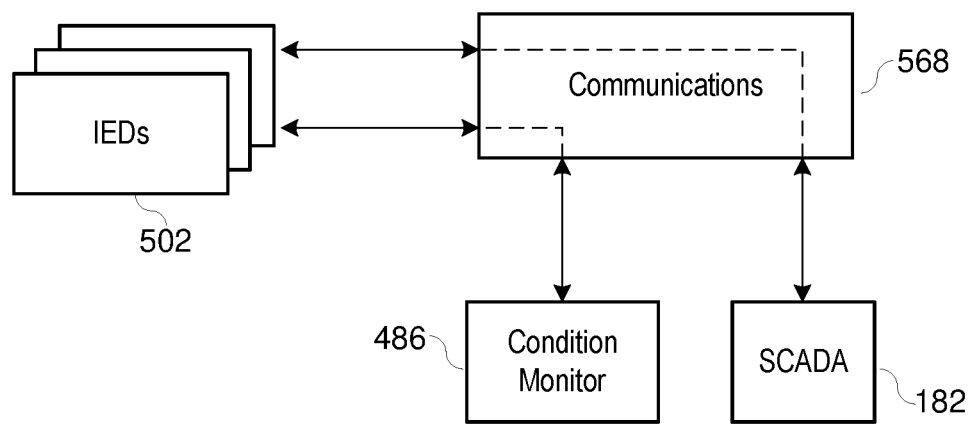
FIG. 5 illustrates a simplified block diagram of a system for mitigation of gratuitous conditions according to several embodiments.

FIG. 5 illustrates a functional block diagram of one embodiment of a system for mitigating gratuitous conditions on an electric power delivery system. According to the illustrated embodiment, IEDs 502 receive communications using a communications system 568. The communications system 568 may include various physical and logical components for facilitating communication among IEDs, between IEDs and supervisory systems such as SCADA 182, between IEDs and other supervisory systems, time sources, and the like. According to the illustrated embodiment, communications may be provided to the IEDs without first passing through the condition monitor 486. For example, communications from SCADA 182 may pass to IEDs without first passing through a condition monitor 486.

As with other embodiments herein, condition monitor 486 may monitor communications to IEDs 502. Such monitoring may be performed in parallel with communications being provided directly to IEDs 502. Upon determination of a gratuitous condition in according with the embodiments herein, the condition monitor 486 may provide a block or interlock signal to IEDs 502. Upon receipt of the block or interlock signal, IEDs 502 may be configured to apply such block or interlock as described herein to mitigate the gratuitous condition.

Although FIG. 5 illustrates separate communication pathways through the communications system 568, these pathways may be logical or physical, and may flow through the same or different hardware.

In several embodiments herein, the block or interlock command may be used to pulse alarm contacts and send warnings to a predetermined recipient(s). IEDs may be configured to pulse alarm contacts and/or send warnings to predetermined recipients upon receipt of the block and/or interlock command from the cyber protection.

Although certain embodiments herein disclose the cyber module as a module of a condition monitor, the cyber protection module herein may be provided on any device that is configured and implemented to monitor communications to IEDs. The cyber module may be implemented in a stand-alone firewall or other cyber protection device Accordingly, the embodiments herein are specifically disclosed and result in improved operation of an electric power delivery system by limiting supervisory commands to IEDs and execution of commands received by IEDs when gratuitous conditions are detected and when the expected result of the command action will result in a gratuitous condition. This results in continued delivery of electric power even when the electric power delivery system may be in a gratuitous condition such as under attack. Furthermore, the embodiments herein are specifically disclosed and result in improved operation of communication devices in an electric power delivery system. That is, the communication devices are more resilient to gratuitous conditions such as a malicious attack by detecting the condition and effecting a blocking of automation commands to IEDs by either blocking the communications themselves or placing the IEDs in an interlock or block state. Accordingly, electric power delivery systems with the present disclosure is more resilient to gratuitous conditions such as gratuitous power outages due to malicious cyber attacks.

The examples and illustrations provided relate to specific embodiments and implementations of a few of the many possible variations. It is understood that the disclosure is not limited to the precise configurations and components disclosed herein. Accordingly, many changes may be made to the details of the above-described embodiments without departing from the underlying principles of this disclosure. The scope of the present invention should, therefore, be determined in the context of the possible claims that are supportable by this disclosure, including the following:

What is claimed is:

1. An electric power system communication device for mitigating an insecurity condition of an electric power delivery system, comprising:
    a processor;
    a communications network interface in communication with a supervisory system, and configured to receive supervisory commands from the supervisory system;
    an intelligent electronic device (IED) interface in communication with an IED for:
        providing the supervisory commands from the supervisory system to the IED; and
        receiving IED status information from the IED;
    cyber logic computer instructions that when executed by the processor cause the electric power system communication device to:
    receive the supervisory commands from the supervisory system;
    detect a gratuitous condition by comparing a predetermined gratuitous condition Indication with the supervisory commands from the supervisory system; and
    when the gratuitous condition is determined, effect a blocking operation of the supervisory commands from being executed by the IED.

2. The device of claim 1, wherein the blocking operation comprises sending an interlock command to the IED.

3. The device of claim 1, wherein the blocking operation comprises blocking communication of the supervisory command from being transmitted to the IED.

4. The device of claim 1, wherein the predetermined gratuitous condition indication comprises settings by an operator at a time of configuration of the electric power system communication device.

5. The device of claim 1, wherein the predetermined gratuitous condition indication comprises receipt of multiple open commands from the supervisory system.

6. The device of claim 5, wherein the multiple open commands are commands for multiple different IEDs to open circuit breakers associated with the multiple different IEDs.

7. The device of claim 5, wherein the multiple open commands are commands originating from outside a substation of the electric power delivery system.

8. The device of claim 1, wherein the predetermined gratuitous condition indication comprises states of electric power system switches during a normal operating condition.

9. The device of claim 1, wherein the predetermined gratuitous condition indication comprises a number of open commands within a predetermined time.

10. The device of claim 1, wherein the predetermined gratuitous condition indication comprises a supervisory command received without indication of a maintenance condition.

11. The device of claim 1, wherein the predetermined gratuitous condition indication comprises a supervisory command received without indication of an external weather condition.

12. The device of claim 1, wherein the cyber logic computer instructions further comprise instructions that when executed by the processor cause the electric power system communication device to retract the blocking operation upon receipt of a reset command.

13. The device of claim 12, wherein the reset command is transmitted from within a substation of the electric power delivery system.

14. A mitigation system for mitigating an insecurity condition on an electric power delivery system, comprising:
    an intelligent electronic device (IED) in communication with a portion of the electric power delivery system to receive electric power system information and effect an operation on equipment of the electric power delivery system;
    a supervisory system in communication with the IED for receiving communication from the IED and sending supervisory commands to the IED via a communication device;
    the communication device in communication with the IED and the supervisory system for communicating between the supervisory system and the IED, comprising:
        a processor;
        cyber logic computer instructions that when executed by the processor cause the communication device to:
            receive the supervisory commands from the supervisory system;
            detect a gratuitous condition by comparing a predetermined gratuitous condition indication with the supervisory commands from the supervisory system; and
            when the gratuitous condition is determined, effect a blocking operation of supervisory commands from being executed by the IED.

15. The system of claim 14, wherein the blocking operation comprises sending an interlock command to the IED.

16. The system of claim 14, wherein the blocking operation comprises blocking communication of the supervisory command from being transmitted to the IED.

17. The system of claim 14, wherein the cyber logic computer instructions further comprise instructions that when executed by the processor cause the communication device to retract the blocking operation upon receipt of a reset command.

18. A method for mitigating insecurity on an electric power delivery system, the method comprising:
- establishing a predetermined gratuitous condition indication for the electric power delivery system;
- receiving supervisory commands from a supervisory system;
- receiving status of intelligent electronic devices ("IEDs") providing protection and supervisory operations on the electric power delivery system;
- compare the supervisory commands from the supervisory system and the status of IEDs with the predetermined gratuitous condition indication;
- when the predetermined gratuitous condition indication is not met, communicating the supervisory commands from the supervisory system to the IEDs; and
- when the predetermined gratuitous condition indication is met, effecting a blocking operation of the supervisory commands from being executed by the IEDs.

19. The electric power system communication device of claim 1, wherein the cyber logic computer instructions cause the electric power system communication device to continue to allow communications between IEDs when the gratuitous condition is determined.

20. The mitigation system of claim 14, wherein the cyber logic computer instructions of the communication device further cause the communication device to continue to allow communications between the IED and another IED when the gratuitous condition is determined.

21. The method of claim 18, further comprising:
- when the established gratuitous condition indication is met, continue to allow communications between IEDs.

* * * * *